(12) United States Patent
Zhu et al.

(10) Patent No.: US 9,917,557 B1
(45) Date of Patent: Mar. 13, 2018

(54) CALIBRATION FOR AMPLIFIER WITH CONFIGURABLE FINAL OUTPUT STAGE

(71) Applicant: Cirrus Logic International Semiconductor Ltd., Edinburgh (GB)

(72) Inventors: Lei Zhu, Austin, TX (US); Xin Zhao, Austin, TX (US); Tejasvi Das, Austin, TX (US); Alan Mark Morton, Austin, TX (US); Xiaofan Fei, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/488,979

(22) Filed: Apr. 17, 2017

(51) Int. Cl.
    *G01R 19/00* (2006.01)
    *H03F 3/217* (2006.01)
    *H03F 3/187* (2006.01)

(52) U.S. Cl.
    CPC ........... *H03F 3/2178* (2013.01); *H03F 3/187* (2013.01); *H03F 2200/03* (2013.01); *H03F 2200/375* (2013.01); *H03F 2200/411* (2013.01)

(58) Field of Classification Search
    CPC .................................................... G01R 19/00
    USPC .................................. 330/2, 207 A, 251, 10
    See application file for complete search history.

(56) References Cited

U.S. PATENT DOCUMENTS

| | | |
|---|---|---|
| 4,346,349 A | 8/1982 | Yokoyama |
| 4,441,081 A | 4/1984 | Jenkins |

(Continued)

FOREIGN PATENT DOCUMENTS

| | | |
|---|---|---|
| EP | 0351788 A2 | 7/1989 |
| EP | 0966105 A2 | 12/1999 |

(Continued)

OTHER PUBLICATIONS

Thaden, Rainer et al., A Loudspeaker Management System with FIR/IRR Filtering; AES 32nd International Conference, Hillerod, Denmark, Sep. 21-23, 2007; pp. 1-12.

(Continued)

*Primary Examiner* — Henry Choe
(74) *Attorney, Agent, or Firm* — Jackson Walker L.L.P.

(57) ABSTRACT

A method for offset calibration may include decoupling a modulator input of a first path from a first stage output, coupling a second path output to the modulator input, applying a common-mode voltage to a second path input, receiving a calibration signal from the modulator output generated in response to the common-mode voltage, and modifying one or more parameters of the modulator to compensate for an offset between the first path and the second path indicated by the calibration signal. A method for gain calibration may include decoupling a modulator input from a first stage output, decoupling a second path from the first stage output, applying a first test signal to the modulator input, applying a second test signal to a second path input, wherein the second test signal is of opposite phase as the first test signal, coupling a second path output to an amplifier input via a calibration feedback network, receiving a calibration signal from the first stage output generated in response to the first test signal and the second test signal, and modifying one or more parameters of the second path to compensate for a difference in respective gains of the modulator and the second path indicated by the calibration signal.

14 Claims, 7 Drawing Sheets

(56) References Cited

U.S. PATENT DOCUMENTS

| | | | |
|---|---|---|---|
| 4,446,440 A | 5/1984 | Bell | |
| 4,493,091 A | 1/1985 | Gundry | |
| 4,890,107 A | 12/1989 | Pearce | |
| 4,972,436 A | 11/1990 | Halim et al. | |
| 4,999,628 A | 3/1991 | Kakaubo et al. | |
| 4,999,830 A | 3/1991 | Agazzi | |
| 5,077,539 A | 12/1991 | Howatt | |
| 5,148,167 A | 9/1992 | Ribner | |
| 5,198,814 A | 3/1993 | Ogawara et al. | |
| 5,272,449 A | 12/1993 | Izawa | |
| 5,321,758 A | 6/1994 | Charpentier et al. | |
| 5,323,159 A | 6/1994 | Imamura et al. | |
| 5,343,161 A | 8/1994 | Tokumo et al. | |
| 5,550,923 A | 7/1996 | Hotvet et al. | |
| 5,600,317 A | 2/1997 | Knoth et al. | |
| 5,714,956 A | 2/1998 | Jahne et al. | |
| 5,719,641 A | 2/1998 | Mizoguchi | |
| 5,796,303 A | 8/1998 | Vinn et al. | |
| 5,808,575 A | 9/1998 | Himeno et al. | |
| 5,810,477 A | 9/1998 | Abraham et al. | |
| 6,088,461 A | 7/2000 | Lin | |
| 6,160,455 A | 12/2000 | French et al. | |
| 6,201,490 B1 | 3/2001 | Kawano et al. | |
| 6,271,780 B1 | 8/2001 | Gong et al. | |
| 6,333,707 B1 | 12/2001 | Oberhammer et al. | |
| 6,353,404 B1 | 3/2002 | Kuroiwa | |
| 6,542,612 B1 | 4/2003 | Needham | |
| 6,614,297 B2 | 9/2003 | Score et al. | |
| 6,683,494 B2 | 1/2004 | Stanley | |
| 6,745,355 B1 | 6/2004 | Tamura | |
| 6,768,443 B2 | 7/2004 | Willis | |
| 6,822,595 B1 | 11/2004 | Robinson | |
| 6,853,242 B2 | 2/2005 | Melanson et al. | |
| 6,888,888 B1 | 5/2005 | Tu et al. | |
| 6,897,794 B2 | 5/2005 | Kuyel et al. | |
| 6,989,955 B2 | 1/2006 | Ziemer et al. | |
| 7,020,892 B2 | 3/2006 | Levesque et al. | |
| 7,023,268 B1 | 4/2006 | Taylor et al. | |
| 7,061,312 B2 | 6/2006 | Andersen et al. | |
| 7,167,112 B2 | 1/2007 | Andersen et al. | |
| 7,216,249 B2 | 5/2007 | Fujiwara et al. | |
| 7,279,964 B2 | 10/2007 | Bolz et al. | |
| 7,302,354 B2 | 11/2007 | Zhuge | |
| 7,312,734 B2 | 12/2007 | McNeill et al. | |
| 7,315,204 B2 | 1/2008 | Seven | |
| 7,365,664 B2 | 4/2008 | Caduff et al. | |
| 7,378,902 B2 | 5/2008 | Sorrells et al. | |
| 7,385,443 B1 | 6/2008 | Denison | |
| 7,403,010 B1 | 7/2008 | Hertz | |
| 7,440,891 B1 | 10/2008 | Shozakai et al. | |
| 7,522,677 B2 | 4/2009 | Liang | |
| 7,583,215 B2 | 9/2009 | Yamamoto et al. | |
| 7,671,768 B2 | 3/2010 | De Ceuninck | |
| 7,679,538 B2 | 3/2010 | Tsang | |
| 7,737,776 B1 * | 6/2010 | Cyrusian | H03F 3/217 330/10 |
| 7,893,856 B2 | 2/2011 | Ek et al. | |
| 7,924,189 B2 | 4/2011 | Sayers | |
| 7,937,106 B2 | 5/2011 | Sorrells et al. | |
| 8,060,663 B2 | 11/2011 | Murray et al. | |
| 8,130,126 B2 | 3/2012 | Breitschaedel et al. | |
| 8,298,425 B2 | 10/2012 | Kanbe | |
| 8,330,631 B2 | 12/2012 | Kumar et al. | |
| 8,362,936 B2 | 1/2013 | Ledzius et al. | |
| 8,462,035 B2 | 6/2013 | Schimper et al. | |
| 8,483,753 B2 | 7/2013 | Behzad et al. | |
| 8,508,397 B2 | 8/2013 | Hisch | |
| 8,717,211 B2 | 5/2014 | Miao et al. | |
| 8,786,477 B1 | 7/2014 | Albinet | |
| 8,836,551 B2 | 9/2014 | Nozaki | |
| 8,873,182 B2 | 10/2014 | Liao et al. | |
| 8,878,708 B1 | 11/2014 | Sanders et al. | |
| 8,952,837 B2 | 2/2015 | Kim et al. | |
| 9,071,201 B2 | 6/2015 | Jones et al. | |
| 9,071,267 B1 | 6/2015 | Schneider et al. | |
| 9,071,268 B1 | 6/2015 | Schneider et al. | |
| 9,118,401 B1 | 8/2015 | Nieto et al. | |
| 9,148,164 B1 | 9/2015 | Schneider et al. | |
| 9,171,552 B1 | 10/2015 | Yang | |
| 9,178,462 B2 * | 11/2015 | Kurosawa | H02P 25/034 |
| 9,210,506 B1 | 12/2015 | Nawfal et al. | |
| 9,306,588 B2 | 4/2016 | Das et al. | |
| 9,337,795 B2 | 5/2016 | Das et al. | |
| 9,391,576 B1 | 7/2016 | Satoskar et al. | |
| 9,503,027 B2 | 11/2016 | Zanbaghi | |
| 9,525,940 B1 | 12/2016 | Schneider et al. | |
| 9,543,975 B1 | 1/2017 | Melanson et al. | |
| 9,584,911 B2 | 2/2017 | Das et al. | |
| 9,596,537 B2 | 3/2017 | He et al. | |
| 9,635,310 B2 | 4/2017 | Chang et al. | |
| 9,762,255 B2 | 9/2017 | Satoskar et al. | |
| 9,774,342 B1 | 9/2017 | Schneider et al. | |
| 9,807,504 B2 | 10/2017 | Melanson et al. | |
| 9,813,814 B1 | 11/2017 | Satoskar | |
| 2001/0001547 A1 | 5/2001 | Delano et al. | |
| 2001/0009565 A1 | 7/2001 | Singvall | |
| 2004/0078200 A1 | 4/2004 | Alves | |
| 2004/0184621 A1 | 9/2004 | Andersen et al. | |
| 2005/0068097 A1 | 3/2005 | Kim et al. | |
| 2005/0084037 A1 | 4/2005 | Liang | |
| 2005/0258989 A1 | 11/2005 | Li et al. | |
| 2005/0276359 A1 | 12/2005 | Xiong | |
| 2006/0056491 A1 | 3/2006 | Lim et al. | |
| 2006/0064037 A1 | 3/2006 | Shalon et al. | |
| 2006/0098827 A1 | 5/2006 | Paddock et al. | |
| 2006/0261886 A1 | 11/2006 | Hansen et al. | |
| 2006/0284675 A1 | 12/2006 | Krochmal et al. | |
| 2007/0018719 A1 | 1/2007 | Seven | |
| 2007/0026837 A1 | 2/2007 | Bagchi | |
| 2007/0057720 A1 | 3/2007 | Hand et al. | |
| 2007/0092089 A1 | 4/2007 | Seefeldt et al. | |
| 2007/0103355 A1 | 5/2007 | Yamada | |
| 2007/0120721 A1 | 5/2007 | Caduff et al. | |
| 2007/0123184 A1 | 5/2007 | Nesimoglu et al. | |
| 2007/0146069 A1 | 6/2007 | Wu et al. | |
| 2008/0012639 A1 | 1/2008 | Mels | |
| 2008/0030577 A1 | 2/2008 | Cleary et al. | |
| 2008/0114239 A1 | 5/2008 | Randall et al. | |
| 2008/0143436 A1 | 6/2008 | Xu | |
| 2008/0159444 A1 | 7/2008 | Terada | |
| 2008/0198048 A1 | 8/2008 | Klein et al. | |
| 2008/0292107 A1 | 11/2008 | Bizjak | |
| 2009/0015327 A1 | 1/2009 | Wu et al. | |
| 2009/0021643 A1 | 1/2009 | Hsueh et al. | |
| 2009/0051423 A1 | 2/2009 | Miaille et al. | |
| 2009/0058531 A1 | 3/2009 | Hwang et al. | |
| 2009/0084586 A1 | 4/2009 | Nielsen | |
| 2009/0220110 A1 | 9/2009 | Bazarjani et al. | |
| 2010/0168882 A1 | 7/2010 | Zhang et al. | |
| 2010/0183163 A1 | 7/2010 | Matsui et al. | |
| 2011/0013733 A1 | 1/2011 | Martens et al. | |
| 2011/0025540 A1 | 2/2011 | Katsis | |
| 2011/0029109 A1 | 2/2011 | Thomsen et al. | |
| 2011/0063148 A1 | 3/2011 | Kolze et al. | |
| 2011/0096370 A1 | 4/2011 | Okamoto | |
| 2011/0136455 A1 | 6/2011 | Sundstrom et al. | |
| 2011/0150240 A1 | 6/2011 | Akiyama et al. | |
| 2011/0170709 A1 | 7/2011 | Guthrie et al. | |
| 2011/0188671 A1 | 8/2011 | Anderson et al. | |
| 2011/0228952 A1 | 9/2011 | Lin | |
| 2011/0242614 A1 | 10/2011 | Okada | |
| 2011/0268301 A1 | 11/2011 | Nielsen et al. | |
| 2011/0285463 A1 | 11/2011 | Walker et al. | |
| 2012/0001786 A1 | 1/2012 | Hisch | |
| 2012/0047535 A1 | 2/2012 | Bennett et al. | |
| 2012/0133411 A1 | 5/2012 | Miao et al. | |
| 2012/0177201 A1 | 7/2012 | Ayling et al. | |
| 2012/0177226 A1 | 7/2012 | Silverstein et al. | |
| 2012/0188111 A1 | 7/2012 | Ledzius et al. | |
| 2012/0207315 A1 | 8/2012 | Kimura et al. | |
| 2012/0242521 A1 | 9/2012 | Kinyua | |
| 2012/0250893 A1 | 10/2012 | Carroll et al. | |
| 2012/0263090 A1 | 10/2012 | Porat et al. | |
| 2012/0274490 A1 | 11/2012 | Kidambi et al. | |

(56) References Cited

U.S. PATENT DOCUMENTS

| | | | |
|---|---|---|---|
| 2012/0280726 | A1 | 11/2012 | Colombo et al. |
| 2013/0095870 | A1 | 4/2013 | Phillips et al. |
| 2013/0106635 | A1 | 5/2013 | Doi |
| 2013/0129117 | A1 | 5/2013 | Thomsen et al. |
| 2013/0188808 | A1 | 7/2013 | Pereira et al. |
| 2013/0241753 | A1 | 9/2013 | Nozaki |
| 2013/0241755 | A1 | 9/2013 | Chen et al. |
| 2014/0044280 | A1 | 2/2014 | Jiang |
| 2014/0105256 | A1 | 4/2014 | Hanevich et al. |
| 2014/0105273 | A1 | 4/2014 | Chen et al. |
| 2014/0126747 | A1 | 5/2014 | Huang |
| 2014/0135077 | A1 | 5/2014 | Leviant et al. |
| 2014/0184332 | A1 | 7/2014 | Shi et al. |
| 2014/0269118 | A1 | 9/2014 | Taylor et al. |
| 2014/0368364 | A1 | 12/2014 | Hsu |
| 2015/0009079 | A1 | 1/2015 | Bojer |
| 2015/0170663 | A1 | 6/2015 | Disch et al. |
| 2015/0214974 | A1 | 7/2015 | Currivan |
| 2015/0214975 | A1 | 7/2015 | Gomez et al. |
| 2015/0249466 | A1 | 9/2015 | Elyada |
| 2015/0295584 | A1 | 10/2015 | Das et al. |
| 2015/0327174 | A1 | 11/2015 | Rajagopal et al. |
| 2015/0381130 | A1 | 12/2015 | Das et al. |
| 2016/0072465 | A1 | 3/2016 | Das et al. |
| 2016/0080862 | A1 | 3/2016 | He et al. |
| 2016/0080865 | A1 | 3/2016 | He et al. |
| 2016/0173112 | A1 | 6/2016 | Das et al. |
| 2016/0181988 | A1* | 6/2016 | Du .................... H03G 3/348 330/296 |
| 2016/0286310 | A1 | 9/2016 | Das et al. |
| 2016/0365081 | A1 | 12/2016 | Satoskar et al. |
| 2017/0047895 | A1 | 2/2017 | Zanbaghi |
| 2017/0150257 | A1 | 5/2017 | Das et al. |
| 2017/0212721 | A1 | 7/2017 | Satoskar et al. |

FOREIGN PATENT DOCUMENTS

| | | |
|---|---|---|
| EP | 1244218 A1 | 9/2002 |
| EP | 1575164 A2 | 9/2005 |
| EP | 1689075 A1 | 8/2006 |
| EP | 1753130 A1 | 2/2007 |
| EP | 1798852 A | 6/2009 |
| EP | 2207264 A1 | 7/2010 |
| GB | 1599401 A | 9/1981 |
| GB | 2119189 A | 11/1983 |
| GB | 2307121 A | 6/1997 |
| GB | 2507096 A | 4/2014 |
| GB | 2527637 A | 12/2015 |
| GB | 2527637 B | 10/2016 |
| GB | 2537694 A | 10/2016 |
| GB | 2537697 A | 10/2016 |
| GB | 2539517 A | 12/2016 |
| JP | 2008294803 A | 12/2008 |
| WO | WO0054403 A1 | 9/2000 |
| WO | 02/37686 A2 | 5/2002 |
| WO | 2004057754 A1 | 7/2004 |
| WO | 2006018750 A1 | 2/2006 |
| WO | 2007005380 A2 | 1/2007 |
| WO | 2007136800 A2 | 11/2007 |
| WO | 2008067260 A1 | 6/2008 |
| WO | 2014113471 A1 | 7/2014 |
| WO | 2015160655 A1 | 10/2015 |
| WO | 2016040165 A1 | 3/2016 |
| WO | 2016040171 A1 | 3/2016 |
| WO | 2016040177 A1 | 3/2016 |
| WO | 2016160336 A1 | 10/2016 |
| WO | 2016202636 A1 | 12/2016 |

OTHER PUBLICATIONS

Thaden, Rainer et al., A Loudspeaker Management System with FIR/IRR Filtering; Slides from a presentation given at the 32nd AES conference "DSP for Loudspeakers" in Hillerod, Denmark in Sep. 2007; http://www.four-audio.com/data/AES32/AES32FourAudio.pdf; 23 pages.

GB Patent Application No. 1419651.3, Improved Analogue-to-Digital Convertor, filed Nov. 4, 2014, 65 pages.

Combined Search and Examination Report, GB Application No. GB1506258.1, Oct. 21, 2015, 6 pages.

International Search Report and Written Opinion, International Patent Application No. PCT/US2015/025329, dated Aug. 11, 2015, 9 pages.

International Search Report and Written Opinion, International Patent Application No. PCT/US2015/048633, dated Dec. 10, 2015, 11 pages.

International Search Report and Written Opinion, International Patent Application No. PCT/US2015/048591, dated Dec. 10, 2015, 11 pages.

Combined Search and Examination Report, GB Application No. GB1510578.6, dated Aug. 3, 2015, 3 pages.

International Search Report and Written Opinion, International Application No. PCT/US2015/056357, dated Jan. 29, 2015, 13 pages.

Combined Search and Examination Report, GB Application No. GB1514512.1, Feb. 11, 2016, 7 pages.

International Search Report and Written Opinion, International Application No. PCT/US2015/048609, dated Mar. 23, 2016, 23 pages.

International Search Report and Written Opinion, International Application No. PCT/US2016/022578, dated Jun. 22, 2016, 12 pages.

Combined Search and Examination Report, GB Application No. GB1600528.2, Jul. 7, 2016, 8 pages.

Combined Search and Examination Report, GB Application No. GB1603628.7, Aug. 24, 2016, 6 pages.

International Search Report and Written Opinion, International Application No. PCT/EP2016/062862, dated Aug. 26, 2016, 14 pages.

Combined Search and Examination Report, GB Application No. GB1602288.1, Aug. 9, 2016, 6 pages.

International Search Report and Written Opinion of the International Searching Authority, International Application No. PCT/US2016/065134, dated Mar. 15, 2017.

International Search Report and Written Opinion of the International Searching Authority, International Application No. PCT/US2016/040096, dated Mar. 24, 2017.

International Search Report and Written Opinion of the International Searching Authority, International Application No. PCT/US2017/014240, dated Apr. 24, 2017.

Groeneweg, B.P., et al., A Class-AB/D Audio Power Amplifier for Mobile Applications Integrated Into a 2.5G/3G Baseband Processo1016r, IEEE Transactions on Circuits and Systems—I: Regular Papers, vol. 57, No. 5, May 2010, pp. 1003-1016.

Chen, K., et al., A High-PSRR Reconfigurable Class-AB/D Audio. Amplifier Driving a Hands-Free/Receiver. 2-in-1 Loudspeaker, IEEE Journal of Solid-State Circuits, vol. 47, No. 11, Nov. 2012, pp. 2586-2603.

Combined Search and Examination Report under Sections 17 and 18(3) of the UKIPO, Application No. GB1620427.3, dated Jun. 1, 2017.

Combined Search and Examination Report under Sections 17 and 18(3) of the UKIPO, Application No. GB1620428.1, dated Jul. 21, 2017.

Combined Search and Examination Report under Sections 17 and 18(3), United Kingdom Intellectual Property Office, Application No. GB1700371.6, dated Aug. 1, 2017.

Combined Search and Examination Report under Sections 17 and 18(3), United Kingdom Intellectual Property Office, Application No. GB1702540.4, dated Oct. 2, 2017.

Combined Search and Examination Report under Sections 17 and 18(3), United Kingdom Intellectual Property Office, Application No. GB1702655.0, dated Oct. 24, 2017.

Combined Search and Examination Report under Sections 17 and 18(3), United Kingdom Intellectual Property Office, Application No. GB1706693.7, dated Oct. 26, 2017.

(56) References Cited

OTHER PUBLICATIONS

Combined Search and Examination Report under Sections 17 and 18(3), United Kingdom Intellectual Property Office, Application No. GB1706690.3, dated Oct. 30, 2017.
Search Report under Section 17, United Kingdom Intellectual Property Office, Application No. GB1702656.8, dated Oct. 31, 2017.
International Search Report and Written Opinion of the International Searching Authority, International Patent Application No. PCT/US2017/045861, dated Nov. 14, 2017.
International Search Report and Written Opinion of the International Searching Authority, International Patent Application No. PCT/US2017/046083, dated Nov. 14, 2017.
Combined Search and Examination Report under Sections 17 and 18(3), United Kingdom Intellectual Property Office, Application No. GB1708546.5, dated Nov. 22, 2017.
Chen, Kuo-Hsin, et al., A 106dB PSRR Direct Battery Connected Reconfigurable Class-AB/D Speaker Amplifier for Hands-Free/Receiver 2-in-1 Loudspeaker, Solid State Circuits Conference (A-SSCC), 2011 IEEE Asian, November 14, 2011, pp. 221-224.
International Search Report and Written Opinion of the International Searching Authority, International Patent Application No. PCT/US2017/052439, dated Dec. 14, 2017.
Combined Search and Examination Report under Sections 17 and 18(3), United Kingdom Intellectual Property Office, Application No. GB1708544.0, dated Nov. 28, 2017.

\* cited by examiner

CALIBRATION FOR AMPLIFIER WITH CONFIGURABLE FINAL OUTPUT STAGE

RELATED APPLICATION

The present disclosure is related to U.S. patent application Ser. No. 15/277,465, filed Sep. 27, 2016, and entitled "Amplifier with Configurable Final Output Stage," which is incorporated herein by reference.

FIELD OF DISCLOSURE

The present disclosure relates in general to circuits for audio devices, including without limitation personal audio devices, such as wireless telephones and media players, and more specifically, to systems and methods relating to switching between configurations of an amplifier with a configurable final output stage.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers. Generally speaking, a power amplifier amplifies an audio signal by taking energy from a power supply and controlling an audio output signal to match an input signal shape but with a larger amplitude.

One example of an audio amplifier is a class-D amplifier. A class-D amplifier (also known as a "switching amplifier") may comprise an electronic amplifier in which the amplifying devices (e.g., transistors, typically metal-oxide-semiconductor field effect transistors) operate as electronic switches, and not as linear gain devices as in other amplifiers (e.g., class-A, class-B, and class-AB amplifiers). In a class-D amplifier, an analog signal to be amplified may be converted to a series of pulses by pulse-width modulation, pulse-density modulation, or another method of modulation, such that the analog signal is converted into a modulated signal in which a characteristic of the pulses of the modulated signal (e.g., pulse widths, pulse density, etc.) is a function of the magnitude of the analog signal. After amplification with a class-D amplifier, the output pulse train may be converted back to an unmodulated analog signal by passing through a passive low-pass filter, wherein such low-pass filter may be inherent in the class-D amplifier or a load driven by the class-D amplifier. Class-D amplifiers are often used due to the fact that they may be more power efficient than linear analog amplifiers, in that class-D amplifiers may dissipate less power as heat in active devices as compared to linear analog amplifiers. However, class-D amplifiers may have high quiescent power when amplifying low-magnitude signals and may require a large amount of area in order to meet stringent dynamic range requirements in audio devices.

Accordingly, it may be desired to have an amplifier that has a configurable final output stage, wherein the final output stage is configurable between a Class-AB output stage and a Class-D output stage. However, having an amplifier with a configurable output stage may be susceptible to audio artifacts caused by switching between the modes of the final output stage.

SUMMARY

In accordance with the teachings of the present disclosure, one or more disadvantages and problems associated with existing approaches to signal amplification in an audio system may be reduced or eliminated.

In accordance with embodiments of the present disclosure, an amplifier may include a plurality of stages and a calibration subsystem. The plurality of stages may include at least a first stage configured to receive an input signal at an amplifier input and generate at a first stage output an intermediate signal which is a function of the input signal, and a final output stage configured to generate an output signal which is a function of the intermediate signal at an amplifier output. The final output stage may include a first path comprising a modulator having a modulator input for receiving the intermediate signal and configured to generate at a modulator output a modulated signal from the intermediate signal and a plurality of output switches configured to generate the output signal from the modulated signal when the first path is selected to generate the output signal. The final output stage may also include a second path having a second path input for receiving the intermediate signal configured to generate at a second path output the output signal from the intermediate signal when the second path is selected to generate the output signal. The calibration subsystem may be configured to, in a calibration mode, decouple the modulator input from the first stage output, couple the second path output to the modulator input, apply a common-mode voltage to the second path input, receive a calibration signal from the modulator output generated in response to the common-mode voltage, and modify one or more parameters of the modulator to compensate for an offset between the first path and the second path indicated by the calibration signal.

In accordance with these and other embodiments of the present disclosure, an amplifier may include a plurality of stages, a signal feedback network, and a calibration subsystem. The plurality of stages may include at least a first stage configured to receive an input signal at an amplifier input and generate at a first stage output an intermediate signal which is a function of the input signal, and a final output stage configured to generate an output signal which is a function of the intermediate signal at an amplifier output. The final output stage may include a first path comprising a modulator having a modulator input for receiving the intermediate signal and configured to generate at a modulator output a modulated signal from the intermediate signal and a plurality of output switches configured to generate the output signal from the modulated signal when the first path is selected to generate the output signal. The final output stage may also include a second path having a second path input for receiving the intermediate signal configured to generate at a second path output the output signal from the intermediate signal when the second path is selected to generate the output signal. The signal feedback network may be coupled between the amplifier output and the amplifier input. The calibration subsystem may be configured to, in a calibration mode, decouple the modulator input from the first stage output, decouple the second path from the first stage output, apply a first test signal to the modulator input, apply a second test signal to the second path input, wherein the second test signal is of opposite phase as the first test signal, couple the second path output to the amplifier input via a calibration feedback network, receive a calibration signal from the first stage output generated in response to the first test signal and the second test signal, and modify one or more parameters of the second path to compensate for a difference in respective gains of the modulator and the second path indicated by the calibration signal.

In accordance with these and other embodiments of the present disclosure, a method may be provided for a calibration mode of an amplifier comprising a plurality of stages comprising at least a first stage configured to receive an input signal at an amplifier input and generate at a first stage output an intermediate signal which is a function of the input signal, and a final output stage configured to generate an output signal which is a function of the intermediate signal at an amplifier output, and wherein the final output stage comprises a first path comprising a modulator having a modulator input for receiving the intermediate signal and configured to generate at a modulator output a modulated signal from the intermediate signal and a plurality of output switches configured to generate the output signal from the modulated signal when the first path is selected to generate the output signal wherein the final output stage further comprises a second path having a second path input for receiving the intermediate signal configured to generate at a second path output the output signal from the intermediate signal when the second path is selected to generate the output signal. The method may include decoupling the modulator input from the first stage output, coupling the second path output to the modulator input, applying a common-mode voltage to the second path input, receiving a calibration signal from the modulator output generated in response to the common-mode voltage, and modifying one or more parameters of the modulator to compensate for an offset between the first path and the second path indicated by the calibration signal.

In accordance with these and other embodiments of the present disclosure, a method may be provided for a calibration mode of an amplifier comprising a plurality of stages comprising at least a first stage configured to receive an input signal at an amplifier input and generate at a first stage output an intermediate signal which is a function of the input signal, and a final output stage configured to generate an output signal which is a function of the intermediate signal at an amplifier output, and wherein the final output stage comprises a first path comprising a modulator having a modulator input for receiving the intermediate signal and configured to generate at a modulator output a modulated signal from the intermediate signal and a plurality of output switches configured to generate the output signal from the modulated signal when the first path is selected to generate the output signal wherein the final output stage further comprises a second path having a second path input for receiving the intermediate signal configured to generate at a second path output the output signal from the intermediate signal when the second path is selected to generate the output signal. The method may include decoupling the modulator input from the first stage output, decoupling the second path from the first stage output, applying a first test signal to the modulator input, applying a second test signal to the second path input, wherein the second test signal is of opposite phase as the first test signal, coupling the second path output to the amplifier input via a calibration feedback network, receiving a calibration signal from the first stage output generated in response to the first test signal and the second test signal, and modifying one or more parameters of the second path to compensate for a difference in respective gains of the modulator and the second path indicated by the calibration signal.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
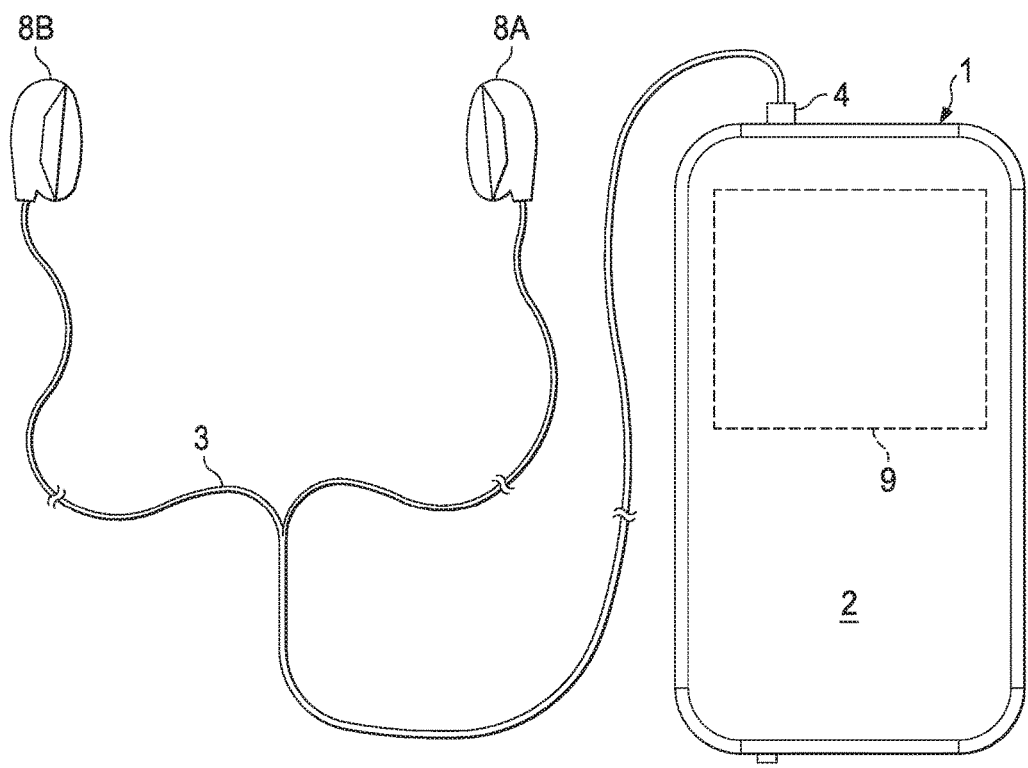
FIG. 1 is an illustration of an example personal audio device, in accordance with embodiments of the present disclosure.

FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer.

Figure 2:
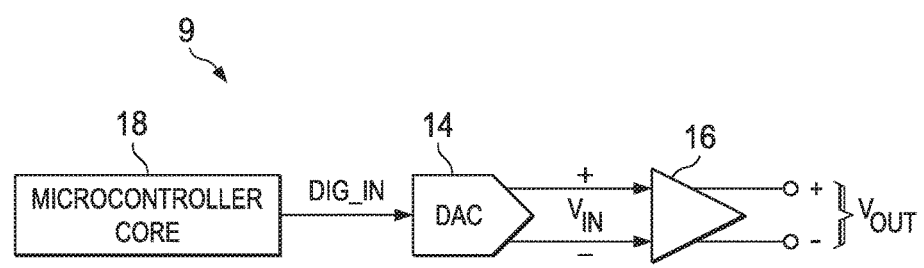
FIG. 2 is a block diagram of selected components of an example audio integrated circuit of a personal audio device, in accordance with embodiments of the present disclosure.

FIG. 2 is a block diagram of selected components of an example audio IC 9 of a personal audio device, in accordance with embodiments of the present disclosure. In some embodiments, example audio IC 9 may be used to implement audio IC 9 of FIG. 1. As shown in FIG. 2, a microcontroller core 18 may supply a digital audio input signal DIG_IN to a digital-to-analog converter (DAC) 14, which may convert the digital audio input signal to an analog input signal $V_{IN}$. DAC 14 may supply analog signal $V_{IN}$ to an amplifier 16 which may amplify or attenuate analog input signal $V_{IN}$ to provide an audio output signal $V_{OUT}$, which may operate a speaker, headphone transducer, a line level signal output, and/or other suitable output.

Figure 3:
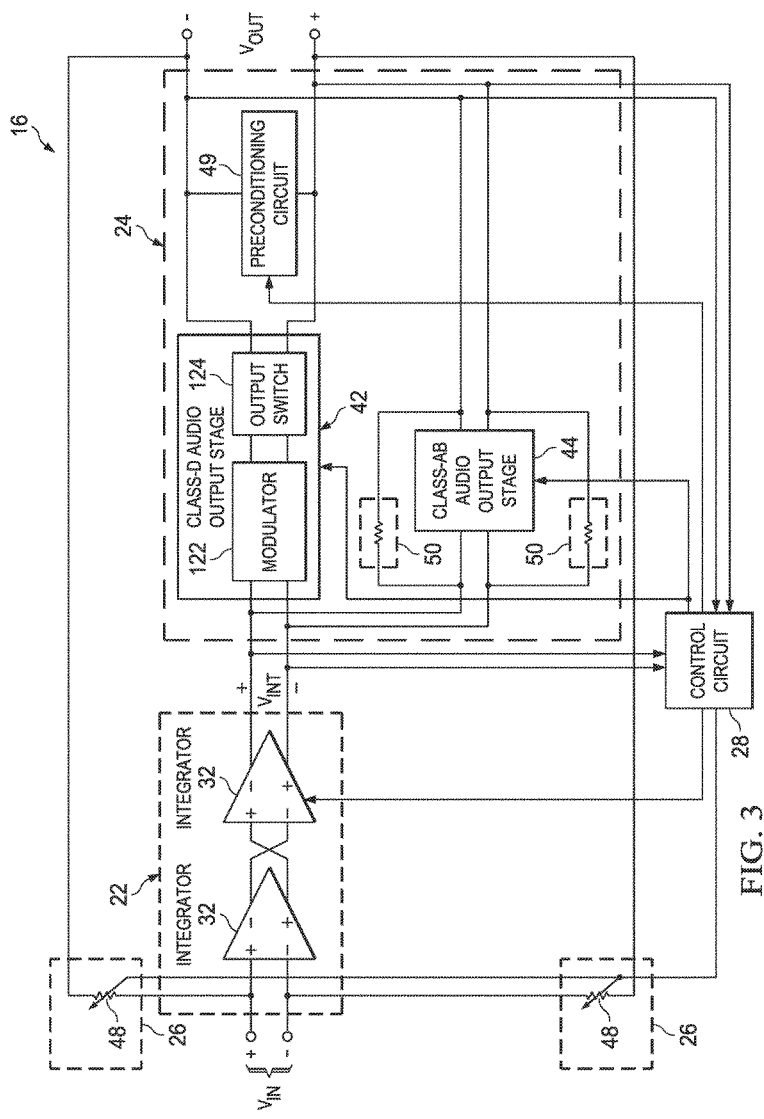
FIG. 3 is a block diagram of selected components of an example amplifier, in accordance with embodiments of the present disclosure.

FIG. 3 is a block diagram of selected components of an example amplifier 16, in accordance with embodiments of the present disclosure. As shown in FIG. 3, amplifier 16 may include a first stage 22 (e.g., an analog front end) configured to receive analog input signal $V_{IN}$ at an amplifier input of amplifier 16 and generate an intermediate signal $V_{INT}$ which is a function of analog input signal $V_{IN}$, a final output stage 24 configured to generate audio output signal $V_{OUT}$ at an amplifier output of amplifier 16 as a function of intermediate signal $V_{INT}$, a signal feedback network 26 coupled between the amplifier output and the amplifier input, and a control circuit 28 for controlling the operation of certain components of amplifier 16, as described in greater detail below.

First stage 22 may include any suitable analog front end circuit for conditioning analog input signal $V_{IN}$ for use by final output stage 24. For example, first stage 22 may include one or more analog integrators 32 cascaded in series, as shown in FIG. 3.

Final output stage 24 may include any suitable driving circuit for driving audio output signal $V_{OUT}$ as a function of intermediate signal $V_{INT}$ (thus, also making audio output signal $V_{OUT}$ a function of analog input signal $V_{IN}$) wherein final output stage 24 is switchable among a plurality of modes including at least a first mode in which final output stage 24 generates audio output signal $V_{OUT}$ as a modulated output signal which is a function of intermediate signal $V_{INT}$ and a second mode in which final output stage 24 generates audio output signal $V_{OUT}$ as an unmodulated output signal which is a function of intermediate signal $V_{INT}$. To carry out this functionality, final output stage 24 may include a class-D audio output stage 42 which may be enabled in the first mode (and disabled in the second mode) to generate audio output signal $V_{OUT}$ as a modulated output signal which is a function of intermediate signal $V_{INT}$ and a class-AB audio output stage 44 which may be enabled in the second mode (and disabled in the first mode) to generate audio output signal $V_{OUT}$ as an unmodulated output signal which is a function of intermediate signal $V_{INT}$.

Class-D audio output stage 42 may comprise any suitable system, device, or apparatus configured to amplify intermediate signal $V_{INT}$ and convert intermediate signal $V_{INT}$ into a series of pulses by pulse-width modulation, pulse-density modulation, or another method of modulation, such that intermediate signal $V_{INT}$ is converted into a modulated signal in which a characteristic of the pulses of the modulated signal (e.g., pulse widths, pulse density, etc.) is a function of the magnitude of intermediate signal $V_{INT}$. After amplification by class-D audio output stage 42, its output pulse train may be converted back to an unmodulated analog signal by passing through a passive low-pass filter, wherein such low-pass filter may be inherent in output circuitry of class-D audio output stage 42 or a load driven by final output stage 24. As shown in FIG. 3, class-D audio output stage 42 may include a control input for receiving a control input from control circuit 28 in order to selectively enable class-D audio output stage 42 during the first mode and disable class-D audio output stage 42 during the second mode (e.g., prevent class-D audio output stage 42 from driving the amplifier output of amplifier 16 by disabling or decoupling a supply voltage from class-D audio output stage 42 or by disabling or decoupling driving devices of the amplifier output of amplifier 16). As shown in FIG. 3, class-D audio output stage 42 may include a modulator 122 having a modulator input for receiving intermediate signal $V_{INT}$ and configured to generate at a modulator output a modulated signal from intermediate signal $V_{INT}$ and also having an output switch block 124 comprising a plurality of output switches configured to generate audio output signal $V_{OUT}$ from the modulated signal when the first mode is enabled.

Figure 4:
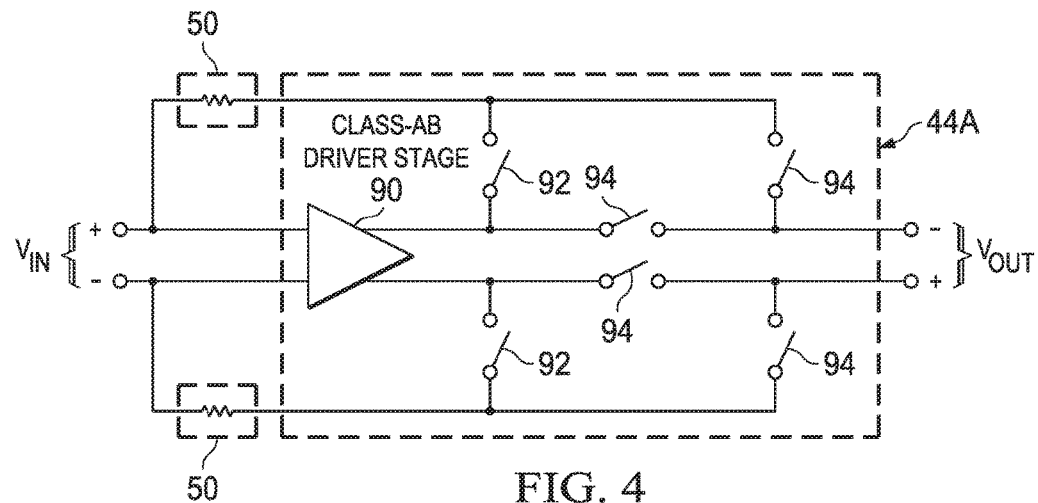
FIG. 4 is a block diagram of selected components of an example class-AB audio output stage, in accordance with embodiments of the present disclosure.
Figure 5:
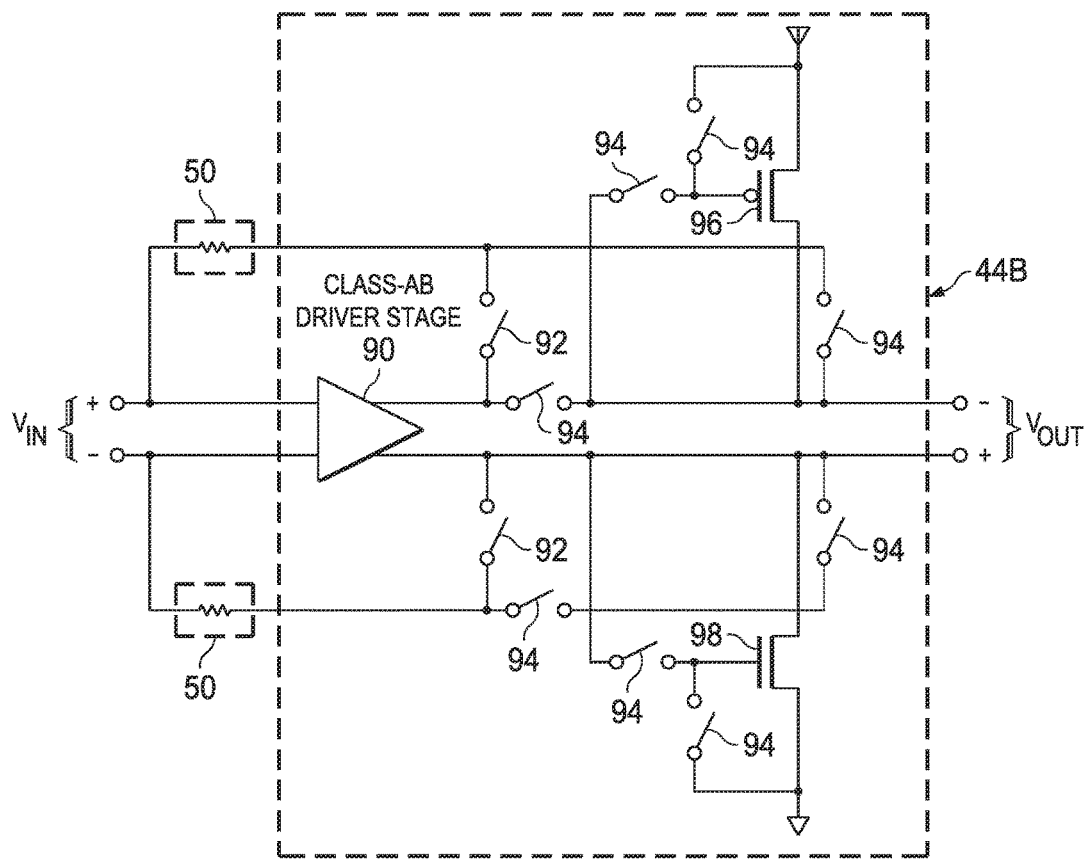
FIG. 5 is a block diagram of selected components of another example class-AB audio output stage, in accordance with embodiments of the present disclosure.

Class-AB audio output stage 44 may comprise any suitable system, device, or apparatus configured to amplify intermediate signal $V_{INT}$ with a linear gain and convert intermediate signal $V_{INT}$ into an unmodulated audio output signal $V_{OUT}$. For example, in some embodiments, unmodulated audio output signal $V_{OUT}$ may include a continuous-time baseband signal (e.g., an audio baseband signal). As shown in FIG. 3, class-AB audio output stage 44 may include a control input for receiving a control input from control circuit 28 in order to selectively enable class-AB audio output stage 44 during the second mode and disable class-AB audio output stage 44 during the first mode (e.g., prevent class-AB audio output stage 44 from driving the amplifier output of amplifier 16 by disabling or decoupling a supply voltage from class-AB audio output stage 44 or by disabling or decoupling driving devices of the amplifier output of amplifier 16). Example implementations of class-AB audio output stage 44 are depicted in FIGS. 4 and 5 and described in greater detail below.

As shown in FIG. 3, final output stage 24 may include a signal feedback network 50 for feeding back a signal indicative of audio output signal $V_{OUT}$ to the input of final output stage 24, thus forming a feedback loop around Class-AB audio output stage 44. For example, as shown in FIG. 3, signal feedback network 50 may include resistors and/or other suitable circuit elements.

In some embodiments, a signal gain (e.g., $V_{OUT}/V_{INT}$) of final output stage 24 in the first mode may be approximately equal to the signal gain of final output stage 24 in the second mode. In these and other embodiments, an offset (e.g., direct current offset) of final output stage 24 in the first mode may be approximately equal to the offset of final output stage 24 in the second mode.

As shown in FIG. 3, final output stage 24 may also include a preconditioning circuit 49 coupled to one or both of the output terminals of the amplifier output of amplifier 16, with preconditioning circuit 49 having a control input received from control circuit 28 for controlling functionality of preconditioning circuit 49, as described in greater detail below. In some embodiments, preconditioning circuit 49 may be configured to precondition at least one of a voltage (e.g., voltage $V_{OUT}$) and a current of the output (e.g., a current flowing into a load coupled across the terminals of voltage $V_{OUT}$) of final output stage 24 prior to switching between modes of final output stage 24 in order to limit audio artifacts caused by switching final output stage 24 between modes. For example, preconditioning circuit 49 may precondition at least one of the voltage and the current of the output of final output stage 24 prior to switching between modes of final output stage 24 by charging each of the output terminals of the output of final output stage 24 to a common mode voltage of a class-AB output driver stage integral to class-AB audio output stage 44. In these and other embodiments, preconditioning circuit 49 may be configured to perform a switching sequence to switch between modes of final output stage 24, such that at all points of the switching sequence, output terminals of the output of final output stage 24 have a known impedance.

Signal feedback network 26 may include any suitable feedback network for feeding back a signal indicative of audio output signal $V_{OUT}$ to the amplifier input of amplifier 16. For example, as shown in FIG. 3, signal feedback network 26 may include variable feedback resistors 48, wherein resistances of variable feedback resistors 48 are controlled by control signals received from control circuit 28, as described in greater detail below.

Thus, final output stage 24 may operate as an open-loop switched-mode driver in the first mode and may operate as a continuous-time closed-loop amplifier in the second mode. In addition, when the final output stage is operating in the second mode, amplifier 16 may comprise a first feedback loop including signal feedback network 26 and a second feedback loop coupled between the amplifier output and the intermediate output implemented by signal feedback network 50.

Control circuit 28 may include any suitable system, device, or apparatus configured to receive information indicative of audio output voltage $V_{OUT}$, intermediate signal $V_{INT}$, and/or other operational characteristic of amplifier 16, and based at least thereon, control operation of one or more components of amplifier 16. For example, control circuit 28 may be configured to, based on a characteristic of analog input signal $V_{IN}$ (e.g., which may be determined from receiving and analyzing intermediate signal $V_{INT}$ and/or audio output signal $V_{OUT}$), switch between the first mode and the second mode of final output stage 24. Such characteristic may include one or more of a frequency of analog input signal $V_{IN}$, an amplitude of analog input signal $V_{IN}$, a signal-to-noise ratio of analog input signal $V_{IN}$, a noise floor of analog input signal $V_{IN}$, or another noise characteristic of analog input signal $V_{IN}$. For example, in some embodiments, control circuit 28 may be configured to switch final output stage 24 from the first mode to the second mode when an amplitude of analog input signal $V_{IN}$ decreases below a threshold amplitude, and may be configured to switch final output stage 24 from the second mode to the first mode when an amplitude of analog input signal $V_{IN}$ increases above the same threshold amplitude or another threshold amplitude. In some embodiments, to reduce audio artifacts associated with switching between modes, control circuit 28 may also be configured to switch between modes only when the amplitude of audio output signal $V_{OUT}$ is approximately zero (e.g., when a modulated signal generated by class-D audio output stage 42 is at its minimum voltage in its generated pulse train).

In these and other embodiments, control circuit 28 may further be configured to, in order to reduce audio artifacts induced by switching between the two modes, cause final output stage 24 to switch between the first mode and the second mode at an approximate completion of a modulation period of the modulated output signal output by Class-D audio output stage 42, and cause final output stage 24 to switch between the second mode and the first mode at an approximate beginning of another modulation period of the modulated output signal output by Class-D audio output stage 42.

In these and other embodiments, control circuit 28 may further be configured to, in order to reduce audio artifacts induced by switching between the two modes, control preconditioning circuit 49 and components thereof as described elsewhere in this disclosure.

In addition, control circuit 28 may also be configured to perform calibration of final output stage 24. For example, control circuit 28 may receive and analyze intermediate signal $V_{INT}$ and audio output signal $V_{OUT}$ to determine a gain of class-D audio output stage 42 (e.g., the signal gain of final output stage 24 in the first mode) and a gain of class-AB audio output stage 44 (e.g., the signal gain of final output stage 24 in the second mode), and based thereon, modify the gain of class-D audio output stage 42 and/or the gain of class-AB audio output stage 44 in order to calibrate the signal gain of final output stage 24 in the second mode to match the signal gain of final output stage 24 in the first mode. As another example, control circuit 28 may receive and analyze intermediate signal $V_{INT}$ and/or audio output signal $V_{OUT}$ to determine an offset (e.g., direct current offset) of class-D audio output stage 42 (e.g., the offset of final output stage 24 in the first mode) and an offset of class-AB audio output stage 44 (e.g., the offset of final output stage 24 in the second mode), and based thereon, modify the offset of class-D audio output stage 42 and/or the offset of class-AB audio output stage 44 in order to calibrate the offset of final output stage 24 in the second mode to match the offset of final output stage 24 in the first mode.

In these and other embodiments, control circuit 28 may also be configured to control characteristics of first stage 22 (e.g., integrator 32) and/or signal feedback network 26. Control circuit 28 may maintain such characteristics and structure of first stage 22 and signal feedback network 26 as static when switching between the first mode and the second mode of final output stage 24 and when switching between the second mode and the first mode. Maintaining the characteristics and structure of first stage 22 and signal feedback network 26 as static when switching between modes allows the modes to share the same analog front end and feedback network, thus reducing or minimizing the likelihood of mismatched signal gain and offset between the modes, and thus reducing or minimizing audio artifacts caused by switching between modes. However, after control circuit 28 has switched final output stage 24 to the second mode (e.g., amplifier output driven by class-AB audio output stage 44), control circuit 28 may modify characteristics of first stage 22 and/or signal feedback network 26 in order to decrease a noise floor of amplifier 16. For example, in some embodiments, control circuit 28 may modify characteristics of integrator 32 (e.g., resistances and/or capacitances of filters internal to integrator 32) and/or other components of first stage 22 in order to decrease a noise floor of amplifier 16 when final output stage 24 operates in the second mode. As another example, in these and other embodiments, control circuit 28 may modify characteristics of signal feedback network 26 (e.g., resistances of variable feedback resistors 48) in order to decrease a noise floor of amplifier 16 when final output stage 24 operates in the second mode. When making such modification, control circuit 28 may, before switching final output stage from the second mode to the first mode, return such characteristics to their unmodified states.

FIG. 4 is a block diagram of selected components of an example class-AB audio output stage 44A, in accordance with embodiments of the present disclosure. In some embodiments, class-AB audio output stage 44 of amplifier 16 may be implemented using class-AB audio output stage 44A. As depicted, class-AB audio output stage 44A may include a class-AB driver stage 90, switches 92, and switches 94 arranged along with signal feedback network 50 as shown in FIG. 4. In operation, when switching between modes of final output stage 24 from its class-D mode of operation to class-AB mode of operation, such switching may first involve powering on components of class-AB audio output stage 44A including class-AB driver stage 90 from a powered-off or powered-down state. After powering on components of class-AB audio output stage 44A including class-AB driver stage 90, switches 92 may be activated (e.g., closed, enabled, turned on) and switches 94 deactivated (e.g., opened, disabled, turned off) under the control of control signals communicated from control circuit 28 to allow operation of class-AB audio output stage 44A to settle into a normal steady-state operation before coupling the output of class-AB driver stage 90 to the output of final output stage 24. After class-AB output stage 44A has settled (and other conditions for switching between modes of final output stage 24 have been satisfied, as described elsewhere in this disclosure), switches 94 may be activated and switches 92 deactivated under the control of control signals communicated from control circuit 28 in order to couple the output of class-AB driver stage 90 to the output of final output stage 24.

FIG. 5 is a block diagram of selected components of another example class-AB audio output stage 44B, in accordance with embodiments of the present disclosure. In some embodiments, class-AB audio output stage 44 of amplifier 16 may be implemented using class-AB audio output stage 44B. Class-AB audio output stage 44B may in many respects be similar to class-AB audio output stage 44A of FIG. 4, and thus, only the main differences between class-AB audio output stage 44B and class-AB audio output stage 44A may be described below. As shown in FIG. 5, class-AB audio output stage 44B may include a p-type metal-oxide-semiconductor field-effect transistor (p-MOSFET) 96, an n-type metal-oxide-semiconductor field-effect transistor (n-MOSFET) 98, and additional switches 94 beyond those present in class-AB audio output stage 44A of FIG. 4. The characteristics of p-MOSFET 96 and n-MOSFET 98 may be such that they replicate characteristics of analogous devices integral to that of class-AB driver stage 90.

Thus, in operation, when switching between modes of final output stage 24 from its class-D mode of operation to class-AB mode of operation, switches 92 may be activated and switches 94 deactivated under the control of control signals communicated from control circuit 28 to allow operation of class-AB audio output stage 44B to settle into a normal steady-state operation before coupling the output of class-AB driver stage 90 to the output of final output stage 24. After class-AB output stage 44B has settled (and other conditions for switching between modes of final output stage 24 have been satisfied, as described elsewhere in this disclosure), switches 94 may be activated and switches 92 deactivated under the control of control signals communicated from control circuit 28 in order to couple the output of class-AB driver stage 90 to the output of final output stage 24. Accordingly, during the process of switching between modes of final output stage 24 from its class-D mode of operation to class-AB mode of operation, the replica of class-AB driver stage 90 formed by p-MOSFET 96 and n-MOSFET 98 may precondition at least one of the voltage (e.g., voltage $V_{OUT}$) and the current of the output of final output stage 28 by charging the output to a common mode voltage of class-AB driver stage 90 using a replica of class-AB driver stage 90 to provide the common mode voltage.

Although FIG. 5 depicts that the replica of class-AB driver stage 90 formed by p-MOSFET 96 and n-MOSFET 98 is present within class-AB audio output stage 44B, in some embodiments, such replica and one or more other components depicted in FIG. 5 as integral to class-AB audio output stage 44B may instead be integral to preconditioning circuit 49 described elsewhere herein.

Figure 6:
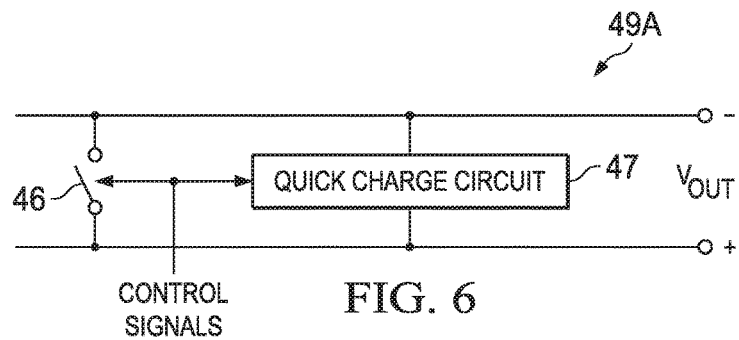
FIG. 6 is a block diagram of selected components of an example preconditioning circuit, in accordance with embodiments of the present disclosure.

FIG. 6 is a block diagram of selected components of an example preconditioning circuit 49A, in accordance with embodiments of the present disclosure. In some embodiments, preconditioning circuit 49 of amplifier 16 may be implemented using preconditioning circuit 49A. As shown in FIG. 6, preconditioning circuit 49A may include a clamp 46 and a quick charge circuit 47. Clamp 46, which may be embodied as a switch, may be coupled between the output terminals of the amplifier output of amplifier 16, with clamp 46 having a control input received from control circuit 28 for selectively enabling clamp 46 (to short the output terminals together) and disabling clamp 46, as described in greater detail below. Quick charge circuit 47 may include any suitable circuit for preconditioning at least one of the voltage (e.g., voltage $V_{OUT}$) and the current of the output of final output stage 24 to a particular voltage and/or current (e.g., to a common-mode voltage of class-AB audio output stage 44).

Figure 7:
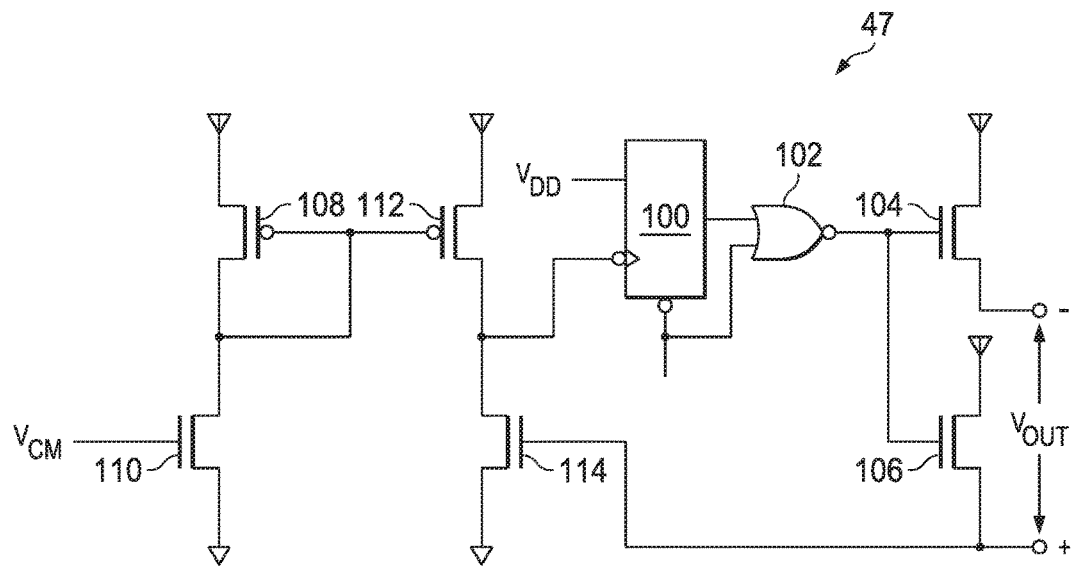
FIG. 7 is a circuit diagram of selected components of an example quick charge circuit, in accordance with embodiments of the present disclosure.

FIG. 7 is a circuit diagram of selected components of an example quick charge circuit 47, in accordance with embodiments of the present disclosure. As depicted in FIG. 7, quick charge circuit 47 may include a flip-flop 100, logic NOR gate 102, n-MOSFET 104, n-MOSFET 106, p-MOSFET 108, n-MOSFET 110, p-MOSFET 112, and n-MOSFET 114 arranged as shown in FIG. 7. In operation, when quick charge circuit 47 is enabled in accordance with one or more control signals communicated from control circuit 28, quick charge circuit 47 may charge the output terminals (which may be coupled together via clamp 46) of final output stage 24 to a common mode voltage $V_{cm}$, which may be a common mode voltage of class-AB audio output stage 44. In operation, n-MOSFET 104 and n-MOSFET 106 may charge the output terminals of final output stage 24, with a current-mode feedback which controls the voltage to which the output terminals are charged. Accordingly, quick charge circuit 47 may also precondition a current on the output of final output stage 24 based on a load present across the terminals of the output of final output stage 24.

Figure 8:
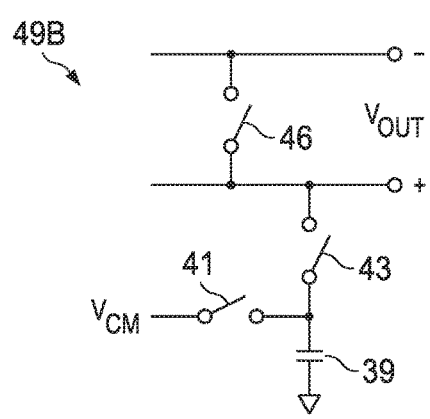
FIG. 8 is a block diagram of selected components of another example preconditioning circuit, in accordance with embodiments of the present disclosure.

FIG. 8 is a block diagram of selected components of another example preconditioning circuit 49B, in accordance with embodiments of the present disclosure. In some embodiments, preconditioning circuit 49 of amplifier 16 may be implemented using preconditioning circuit 49B. As shown in FIG. 8, preconditioning circuit 49B may include a clamp 46, a capacitor 39, and switches 41 and 43 arranged as shown. Clamp 46 of preconditioning circuit 49B may be similar to that of clamp 46 of preconditioning circuit 49A. When preconditioning circuit 49B is enabled under the control of control signals communicated from control circuit 28, clamp 46 may be enabled to short the output terminals of final output stage 24 together, switch 43 may be activated, and switch 41 deactivated to allow charge present on capacitor 39 to charge each of the output terminals of final output stage 24 to a common mode voltage $V_{cm}$. When preconditioning circuit 49B is disabled under the control of control signals communicated from control circuit 28, clamp 46 may be disabled, switch 41 may be activated, and switch 43 deactivated to allow capacitor 39 to charge to common mode voltage $V_{cm}$. Those of skill in the art may recognize that a dual equivalent current source and inductor may be substituted in place of voltage $V_{cm}$ and capacitor 39 such that the inductor may precondition a current of the output terminals of final output stage 24 when preconditioning circuit 49B is enabled.

Figure 9:
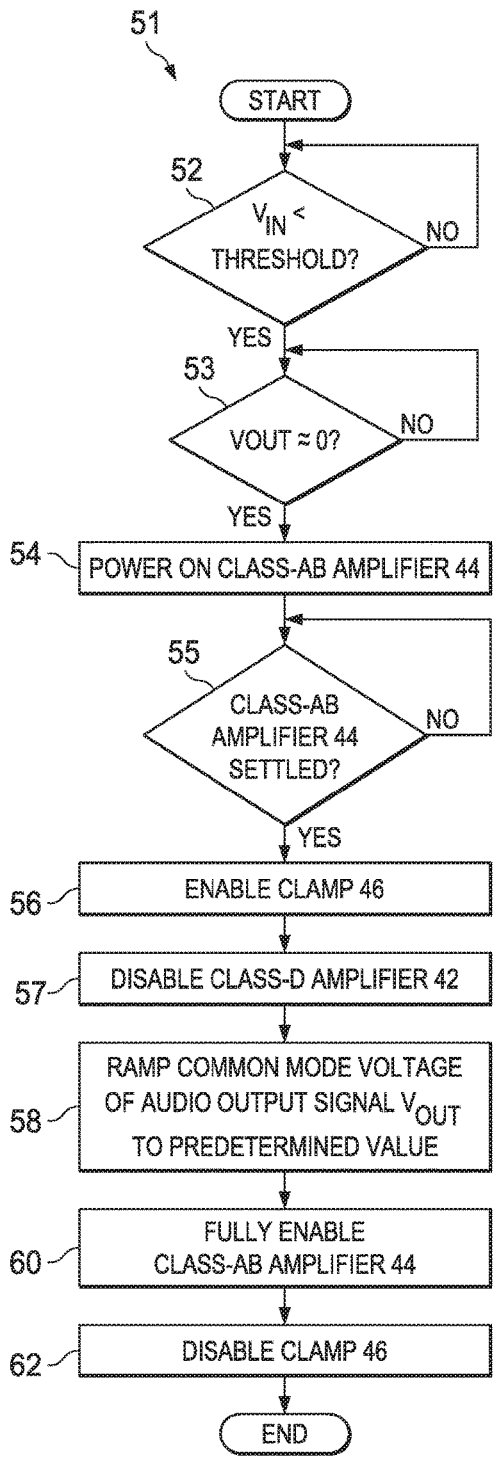
FIG. 9 is a flow chart of an example method for switching between a first mode of a final output stage of an amplifier and a second mode of the final output stage of the amplifier, in accordance with embodiments of the present disclosure.

FIG. 9 is a flow chart of an example method 51 for switching between a first mode of a final output stage 24 of amplifier 16 and a second mode of final output stage 24 of amplifier 16, in accordance with embodiments of the present disclosure. According to some embodiments, method 51 begins at step 52. As noted above, teachings of the present disclosure are implemented in a variety of configurations of personal audio device 1. As such, the preferred initialization point for method 51 and the order of the steps comprising method 51 may depend on the implementation chosen.

At step 52, control circuit 28 may monitor intermediate signal $V_{INT}$, audio output signal $V_{OUT}$, or another signal indicative of analog input signal $V_{IN}$, to determine if analog input signal $V_{IN}$ has decreased from above to below a threshold amplitude. If analog input signal $V_{IN}$ has decreased from above to below the threshold amplitude, method 51 may proceed to step 53. Otherwise, method 51 may remain at step 52 until such threshold amplitude crossing occurs.

At step 53, control circuit 28 may monitor audio output signal $V_{OUT}$ to determine when the amplitude of audio output signal $V_{OUT}$ is approximately zero (e.g., when a modulated signal generated by class-D audio output stage 42 is at its minimum voltage in its generated pulse train). If audio output signal $V_{OUT}$ has reached approximately zero, method 51 may proceed to step 54. Otherwise, method 51 may remain at step 53 until audio output signal $V_{OUT}$ reaches approximately zero.

At step 54, control circuit 28 may cause class-AB amplifier 44 to power on from a powered-off or powered-down state, which state class-AB amplifier 44 may operate in order to save power when final output stage 24 is operating in the class-D mode.

At step 55, control circuit 28 may monitor audio output signal $V_{OUT}$ to determine when class-AB amplifier 44 has settled into a steady-state operation from being powered on. Once class-AB amplifier 44 has settled, method 51 may proceed to step 56.

At step 56, control circuit 28 may enable clamp 46, thus shorting the output terminals at the amplifier output of amplifier 16 together, forcing audio output signal $V_{OUT}$ to zero. At step 57, control circuit 28 may disable class-D amplifier 42. For example, class-D amplifier 42 may be disabled by deactivating switches integral to class-D amplifier 42 such that the output terminals of class-D amplifier 42 are in a high-impedance state.

At step 58, class-AB audio output stage 44 and/or preconditioning circuit 49 may ramp a common mode voltage of audio output signal $V_{OUT}$ to a predetermined value (e.g., a common-mode voltage equal to one-half of a supply voltage for class-AB audio output stage 44). At step 60, control circuit 28 may fully enable class-AB audio output stage 44 such that audio output signal $V_{OUT}$ is an unmodulated signal which is a function of intermediate signal $V_{INT}$.

For example, class-AB amplifier 44 may be enabled by activating switches integral to class-AB amplifier 44 (e.g., switches 94 depicted in FIGS. 4 and 5) such that the output terminals of a class-AB driver stage (e.g., class-AB driver stage 90) integral to class-AB amplifier 44 are coupled to the output terminals of final output stage 24. In some embodiments, steps 56 through 60 may take place when the modulated output signal output by class-D audio output stage 42 is at an approximate completion of a modulation period.

At step 62, control circuit 28 may disable clamp 46, thus allowing audio output signal $V_{OUT}$ to take on a non-zero value driven by class-AB audio output stage 44. After completion of step 62, method 51 may end.

Although FIG. 9 discloses a particular number of steps to be taken with respect to method 51, method 51 may be executed with greater or fewer steps than those depicted in FIG. 9. In addition, although FIG. 9 discloses a certain order of steps to be taken with respect to method 51, the steps comprising method 51 may be completed in any suitable order.

Method 51 may be implemented using personal audio device 1 or any other system operable to implement method 51. In certain embodiments, method 51 may be implemented partially or fully in software and/or firmware embodied in computer-readable media and executable by a controller.

Figure 10:
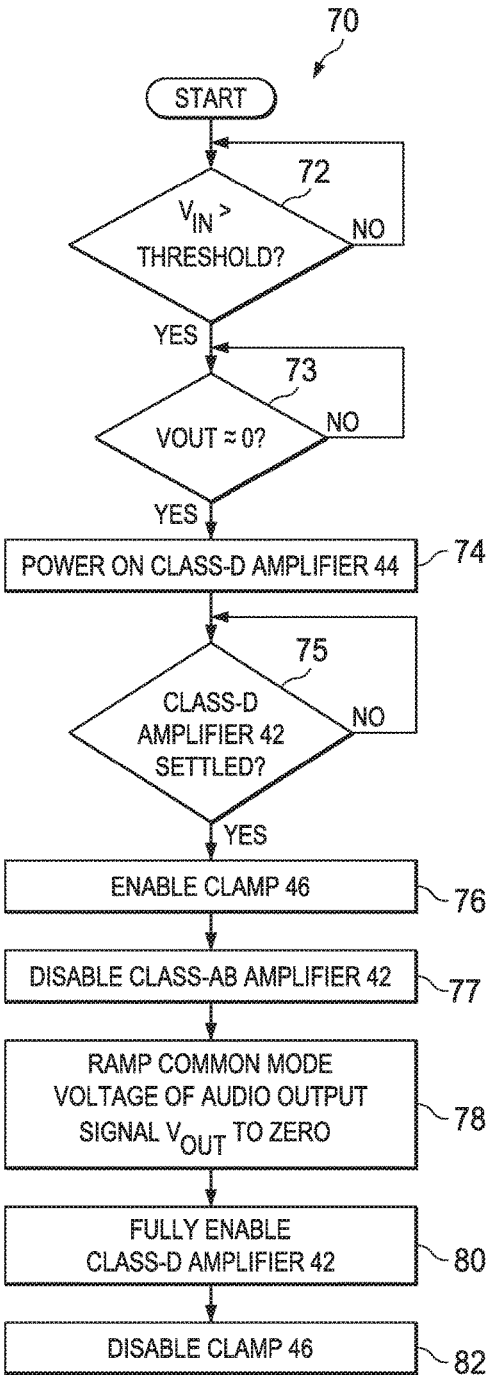
FIG. 10 is a flow chart of an example method for switching between a second mode of a final output stage of an amplifier and a first mode of the final output stage of the amplifier, in accordance with embodiments of the present disclosure.

FIG. 10 is a flow chart of an example method 70 for switching between a second mode of final output stage 24 of amplifier 16 and a first mode of final output stage 24 of amplifier 16, in accordance with embodiments of the present disclosure. According to some embodiments, method 70 begins at step 72. As noted above, teachings of the present disclosure are implemented in a variety of configurations of personal audio device 1. As such, the preferred initialization point for method 70 and the order of the steps comprising method 70 may depend on the implementation chosen.

At step 72, control circuit 28 may monitor intermediate signal $V_{INT}$, audio output signal $V_{OUT}$, or another signal indicative of analog input signal $V_{IN}$, to determine if analog input signal $V_{IN}$ has increased from below to above a threshold amplitude (which may be the same threshold as that of step 52, or a different threshold). If analog input signal $V_{IN}$ has increased from below to above the threshold amplitude, method 70 may proceed to step 73. Otherwise, method 70 may remain at step 72 until such threshold amplitude crossing occurs.

At step 73, control circuit 28 may monitor audio output signal $V_{OUT}$ to determine when the amplitude of audio output signal $V_{OUT}$ is approximately zero (e.g., when audio output signal $V_{OUT}$ experiences a zero crossing). If audio output signal $V_{OUT}$ is approximately zero, method 70 may proceed to step 74. Otherwise, method 70 may remain at step 73 until audio output signal $V_{OUT}$ is approximately zero.

At step 74, control circuit 28 may cause class-D amplifier 42 to power on from a powered-off or powered-down state, which state class-D amplifier 42 may operate in order to save power when final output stage 24 is operating in the class-AB mode.

At step 75, control circuit 28 may monitor audio output signal $V_{OUT}$ to determine when class-D amplifier 42 has settled into a steady-state operation from being powered on. Once class-D amplifier 42 has settled, method 70 may proceed to step 76.

At step 76, control circuit 28 may enable clamp 46, thus shorting the output terminals at the amplifier output of amplifier 16 together, forcing audio output signal $V_{OUT}$ to zero. At step 77, control circuit 28 may disable class-AB amplifier 44. For example, class-AB amplifier 44 may be disabled by activating switches integral to class-AB amplifier 44 (e.g., switches 94 depicted in FIGS. 4 and 5) such that the output terminals of a class-AB driver stage (e.g., class-AB driver stage 90) integral to class-AB amplifier 44 are decoupled to the output terminals of final output stage 24.

At step 78, preconditioning circuit 49 (or another auxiliary amplifier, not shown in FIG. 3) may ramp a common mode voltage of audio output signal $V_{OUT}$ to zero. At step 80, control circuit 28 may fully enable class-D audio output stage 42 such that audio output signal $V_{OUT}$ is a modulated signal which is a function of intermediate signal $V_{INT}$. For example, class-D amplifier 42 may be enabled by activating switches integral to class-D amplifier 42 such that the output terminals of class-D amplifier 42 are coupled to the output terminals of final output stage 24. In some embodiments, steps 76 through 80 may take place when the modulated output signal output by class-D audio output stage 42 is at an approximate beginning of a modulation period.

At step 82, control circuit 28 may disable clamp 46, thus allowing audio output signal $V_{OUT}$ to take on a non-zero value driven by class-D audio output stage 42. After completion of step 82, method 70 may end.

Although FIG. 10 discloses a particular number of steps to be taken with respect to method 70, method 70 may be executed with greater or fewer steps than those depicted in FIG. 10. In addition, although FIG. 10 discloses a certain order of steps to be taken with respect to method 70, the steps comprising method 70 may be completed in any suitable order.

Method 70 may be implemented using personal audio device 1 or any other system operable to implement method 70. In certain embodiments, method 70 may be implemented partially or fully in software and/or firmware embodied in computer-readable media and executable by a controller.

Figure 11:
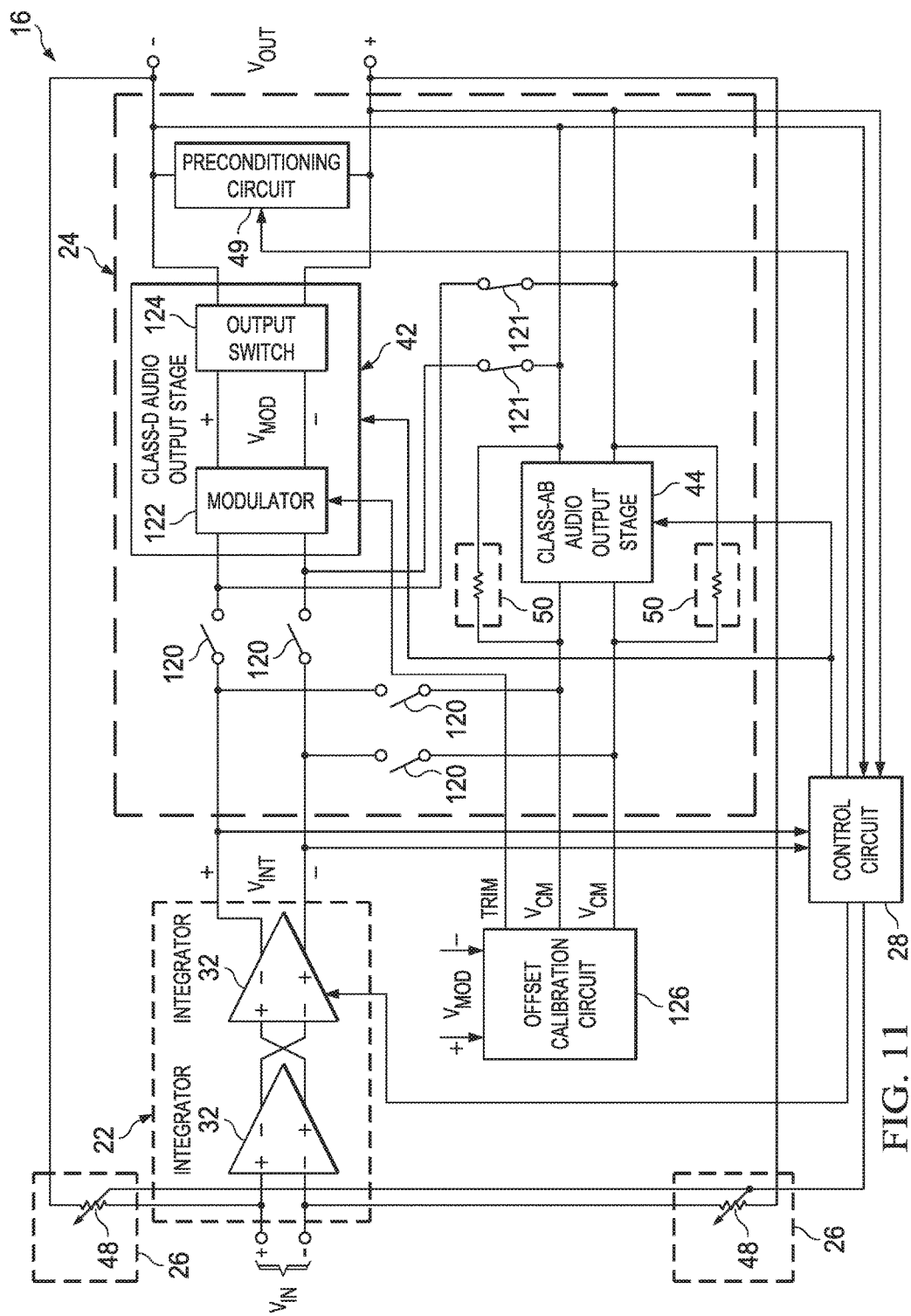
FIG. 11 is a block diagram of selected components of the example amplifier of FIG. 3 modified to include an offset calibration circuit, in accordance with embodiments of the present disclosure.

FIG. 11 is a block diagram of selected components of the example amplifier 16 of FIG. 3 modified to include an offset calibration circuit 126, in accordance with embodiments of the present disclosure. As shown in FIG. 11, to facilitate functionality of offset calibration circuit 126, amplifier 16 may also be modified to include switches 120 and switches 121. Although not explicitly shown in FIG. 11, switches 120 and switches 121 may be controlled by offset calibration circuit 126. In operation, offset calibration circuit 126 may cause amplifier 16 to enter an offset calibration mode to perform offset calibration between Class-D audio output stage 42 and Class-AB audio output stage 44. In such offset calibration mode, offset calibration circuit 126 may deactivate switches 120 to decouple the modulator input of modulator 122 from the output of first stage 22, and decouple the input of Class-AB audio output stage 44 from the output of first stage 22. In addition, in such offset calibration mode, offset calibration circuit 126 may activate switches 121 to couple output of Class-AB audio output stage 44 to the modulator input of modulator 122. Furthermore, in such offset calibration mode, offset calibration circuit 126 may apply a common-mode voltage $V_{cm}$ to the input of Class-AB audio output stage 44, receive a calibration signal $V_{MOD}$ from the output of modulator 122 generated in response to common-mode voltage $V_{cm}$, and based thereon may modify one or more parameters of modulator 122 to compensate for an offset (e.g., a direct current offset) between Class-D audio output stage 42 and Class-AB audio output stage 44 indicated by calibration signal $V_{MOD}$.

Figure 12:
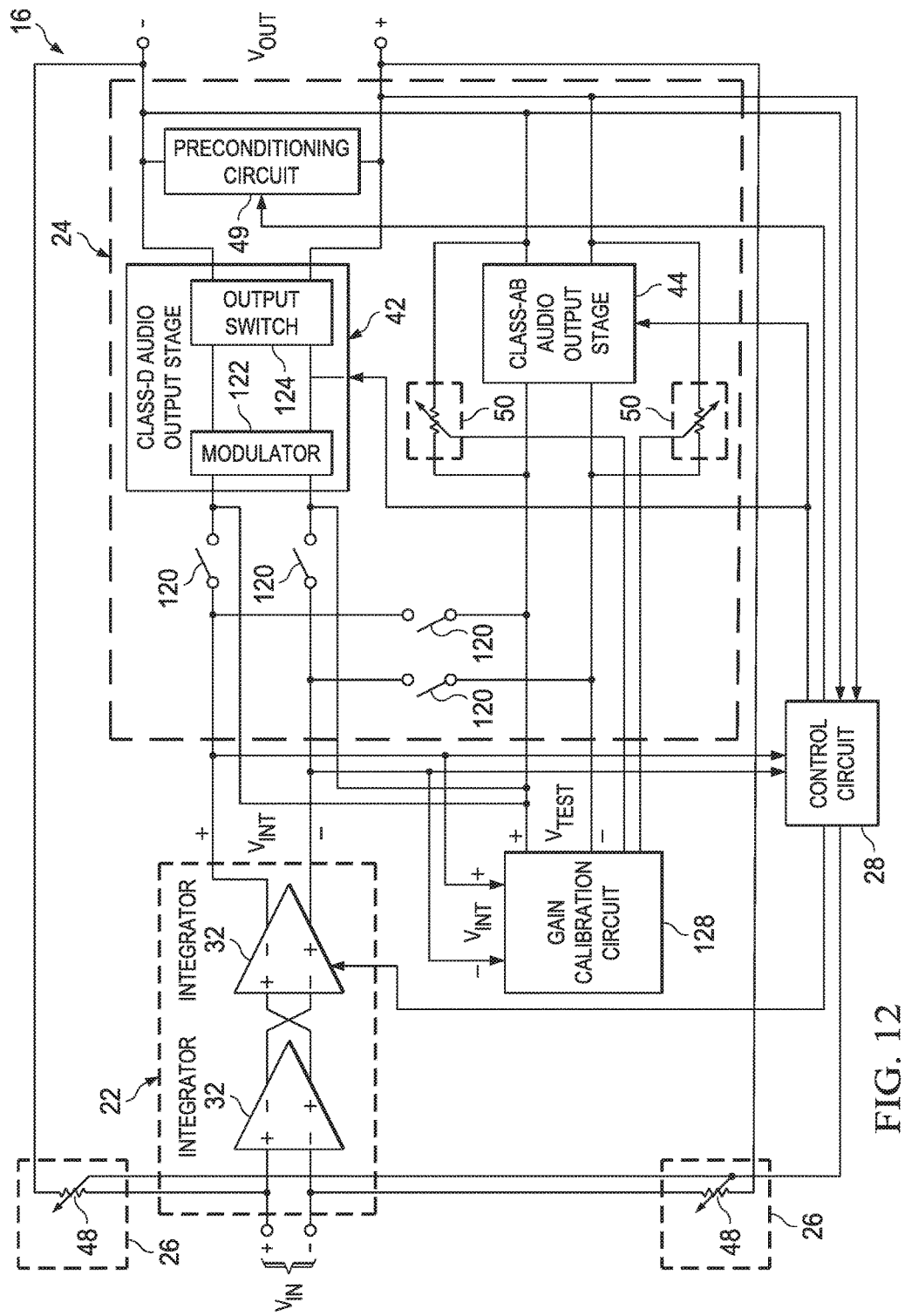
FIG. 12 is a block diagram of selected components of the example amplifier of FIG. 3 modified to include a gain calibration circuit, in accordance with embodiments of the present disclosure.

FIG. 12 is a block diagram of selected components of the example amplifier 116 of FIG. 3 modified to include a gain calibration circuit 128, in accordance with embodiments of the present disclosure. As shown in FIG. 12, to facilitate functionality of gain calibration circuit 128, amplifier 16 may also be modified to include switches 120. Although not explicitly shown in FIG. 12, switches 120 may be controlled by gain calibration circuit 128. In operation, gain calibration circuit 128 may cause amplifier 16 to enter a gain calibration mode to perform gain calibration between Class-D audio output stage 42 and Class-AB audio output stage 44. In such gain calibration mode, gain calibration circuit 128 may deactivate switches 120 to decouple the modulator input of modulator 122 from the output of first stage 22, and decouple the input of Class-AB audio output stage 44 from the output of first stage 22. In addition, in the gain calibration mode, gain calibration circuit 128 may apply a test signal $V_{TEST}$ to the input of Class-AB audio output stage 44 and test signal $-V_{TEST}$ of opposite phase of test signal $V_{TEST}$ to the input of Class-D audio output stage 42. Audio output voltage $V_{OUT}$ generated from the application of such test signals may be a value indicative of a gain mismatch between Class-D audio output stage 42 and Class-AB audio output stage 44. Due to the presence of signal feedback network 26, such audio output voltage $V_{OUT}$ may be fed back to the input of amplifier 16 such that first stage 22 generates intermediate signal $V_{INT}$ as a calibration signal indicative of the gain mismatch between Class-D audio output stage 42 and Class-AB audio output stage 44. Gain calibration circuit 128 may receive such calibration signal from the output of first stage 22, and based thereon, may modify one or more parameters of the Class-AB audio output stage 44 (e.g., modify a gain of Class A-B audio stage 44 by modifying the resistances of signal feedback network 50) to compensate for a difference in respective gains of Class-D audio output stage 42 and Class-AB audio output stage 44.

Although FIGS. 11 and 12 depict offset calibration circuit 126 and gain calibration circuit 128 as separate circuits, in some embodiments offset calibration circuit 126 and gain calibration circuit 128 may be combined into a single calibration circuit capable of performing both offset calibration and gain calibration, as described herein.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. An amplifier comprising:
a plurality of stages comprising at least:
a first stage configured to receive an input signal at an amplifier input and generate at a first stage output an intermediate signal which is a function of the input signal; and
a final output stage configured to generate an output signal which is a function of the intermediate signal at an amplifier output, the final output stage comprising:
a first path comprising:
a modulator having a modulator input for receiving the intermediate signal and configured to generate at a modulator output a modulated signal from the intermediate signal; and
a plurality of output switches configured to generate the output signal from the modulated signal when the first path is selected to generate the output signal; and
a second path having a second path input for receiving the intermediate signal configured to generate at a second path output the output signal from the intermediate signal when the second path is selected to generate the output signal; and
a calibration subsystem configured to, in a calibration mode:
decouple the modulator input from the first stage output;
couple the second path output to the modulator input;
apply a common-mode voltage to the second path input;
receive a calibration signal from the modulator output generated in response to the common-mode voltage; and
modify one or more parameters of the modulator to compensate for an offset between the first path and the second path indicated by the calibration signal.

2. The amplifier of claim 1, wherein the first path comprises a Class D audio output stage.

3. The amplifier of claim 1, wherein the second path comprises a Class AB audio output stage.

4. An amplifier comprising:
a plurality of stages comprising at least:
a first stage configured to receive an input signal at an amplifier input and generate at a first stage output an intermediate signal which is a function of the input signal;
a final output stage configured to generate an output signal which is a function of the intermediate signal at an amplifier output, the final output stage comprising:
a first path comprising:
a modulator having a modulator input for receiving the intermediate signal and configured to generate at a modulator output a modulated signal from the intermediate signal; and
a plurality of output switches configured to generate the output signal from the modulated signal when the first path is selected to generate the output signal; and
a second path having a second path input for receiving the intermediate signal configured to generate at a second path output the output signal from the intermediate signal when the second path is selected to generate the output signal; and
a signal feedback network coupled between the amplifier output and the amplifier input; and
a calibration subsystem configured to, in a calibration mode:
decouple the modulator input from the first stage output;
decouple the second path from the first stage output;
apply a first test signal to the modulator input;
apply a second test signal to the second path input, wherein the second test signal is of opposite phase as the first test signal;
receive a calibration signal from the first stage output generated in response to the first test signal and the second test signal; and
modify one or more parameters of the second path to compensate for a difference in respective gains of the first path and the second path indicated by the calibration signal.

5. The amplifier of claim 4, wherein the first path comprises a Class D audio output stage.

6. The amplifier of claim 4, wherein the second path comprises a Class AB audio output stage.

7. The amplifier of claim 4, wherein the calibration subsystem is further configured to, in a second calibration mode:
decouple the modulator input from the first stage output;
couple the second path output to the modulator input;
apply a common-mode voltage to the second path input;
receive a second calibration signal from the modulator output generated in response to the common-mode voltage; and
modify one or more parameters of the modulator to compensate for an offset between the first path and the second path indicated by the second calibration signal.

8. A method comprising, in a calibration mode of an amplifier comprising a plurality of stages comprising at least a first stage configured to receive an input signal at an amplifier input and generate at a first stage output an intermediate signal which is a function of the input signal, and a final output stage configured to generate an output signal which is a function of the intermediate signal at an amplifier output, and wherein the final output stage comprises a first path comprising a modulator having a modulator input for receiving the intermediate signal and configured to generate at a modulator output a modulated signal from the intermediate signal and a plurality of output switches configured to generate the output signal from the modulated signal when the first path is selected to generate the output signal wherein the final output stage further comprises a second path having a second path input for receiving the intermediate signal configured to generate at a second path output the output signal from the intermediate signal when the second path is selected to generate the output signal:
decoupling the modulator input from the first stage output;
coupling the second path output to the modulator input;
applying a common-mode voltage to the second path input;
receiving a calibration signal from the modulator output generated in response to the common-mode voltage; and modifying one or more parameters of the modulator to compensate for an offset between the first path and the second path indicated by the calibration signal.

9. The method of claim 8, wherein the first path comprises a Class D audio output stage.

10. The method of claim 8, wherein the second path comprises a Class AB audio output stage.

11. A method comprising, in a calibration mode of an amplifier comprising a plurality of stages comprising at least a first stage configured to receive an input signal at an amplifier input and generate at a first stage output an intermediate signal which is a function of the input signal and a final output stage configured to generate an output signal which is a function of the intermediate signal at an amplifier output, and wherein the final output stage comprises a first path comprising a modulator having a modulator input for receiving the intermediate signal and configured to generate at a modulator output a modulated signal from the intermediate signal and a plurality of output switches configured to generate the output signal from the modulated signal when the first path is selected to generate the output signal wherein the final output stage further comprises a second path having a second path input for receiving the intermediate signal configured to generate at a second path output the output signal from the intermediate signal when the second path is selected to generate the output signal:

decoupling the modulator input from the first stage output;

decoupling the second path from the first stage output;

applying a first test signal to the modulator input;

applying a second test signal to the second path input, wherein the second test signal is of opposite phase as the first test signal;

receiving a calibration signal from the first stage output generated in response to the first test signal and the second test signal; and modifying one or more parameters of the second path to compensate for a difference in respective gains of the first path and the second path indicated by the calibration signal.

12. The method of claim 11, wherein the first path comprises a Class D audio output stage.

13. The method of claim 11, wherein the second path comprises a Class AB audio output stage.

14. The method of claim 11, further comprising, in a second calibration mode of the amplifier:

decoupling the modulator input from the first stage output;

coupling the second path output to the modulator input;

applying a common-mode voltage to the second path input;

receiving a second calibration signal from the modulator output generated in response to the common-mode voltage; and modifying one or more parameters of the modulator to compensate for an offset between the first path and the second path indicated by the second calibration signal.

* * * * *